US006307436B1

(12) United States Patent
Hau (10) Patent No.: US 6,307,436 B1
(45) Date of Patent: Oct. 23, 2001

(54) PREDISTORTION TYPE LINEARIZER WITH A RESONANT CIRCUIT AND COMMON GATE FET

(75) Inventor: Gary Hau, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/594,090

(22) Filed: Jun. 15, 2000

(30) Foreign Application Priority Data

Jun. 15, 1999 (JP) .................................................. 11-168788

(51) Int. Cl.[7] ........................................................ H03F 1/32
(52) U.S. Cl. ............................ 330/149; 330/294; 330/302
(58) Field of Search ..................................... 330/149, 277, 330/294, 302

(56) References Cited

U.S. PATENT DOCUMENTS

| 4,465,980 | 8/1984 | Huang et al. | 330/149 |
|---|---|---|---|
| 5,038,113 | 8/1991 | Katz et al. | 330/277 |
| 5,162,748 | * 11/1992 | Katz | 330/149 |
| 5,191,338 | 3/1993 | Katz et al. | 342/352 |
| 5,221,908 | * 6/1993 | Katz et al. | 330/149 |
| 5,523,716 | 6/1996 | Grebliunas et al. | 330/149 |
| 5,821,814 | 10/1998 | Katayama et al. | 330/277 |
| 5,850,162 | 12/1998 | Danielsons | 330/149 |
| 5,886,572 | 3/1999 | Myers et al. | 330/10 |

FOREIGN PATENT DOCUMENTS

| 60-163869 | 10/1985 | (JP) . |
|---|---|---|
| 61-93015 | 6/1986 | (JP) . |
| 5-235646 | 9/1993 | (JP) . |
| 5-251996 | 9/1993 | (JP) . |
| 8-265052 | 10/1996 | (JP) . |
| 2000-357926 | * 12/2000 | (JP) . |

OTHER PUBLICATIONS

R.D. Stewart et al., "Feedforward Linearisation of 950 MHz Amplifiers", *IEE Proceedings–H*, vol. No. 5, pp. 347–350, Oct. 1988.
J. Namiki, "An Automatically Controlled Predistorter for Multilevel Quadrature Amplitude Modulation", May 1983, *IEEE Transactions On Communications*, vol. COM–31, No. 5, pp. 707–712.
A.K. Ezzeddine et al., "An MMAC C–Band FET Feedback Power Amplifier", Apr. 1990, *IEEE Transactions On Microwave Theory Techiques*, vol. MTT–38, No. 4, pp. 350–357.
J.C. Pedro et al., "An MMIC Linearized Amplifier Using Active Feedback", 1993, *IEEE MTT–S DIGEST*, pp. 95–98.

* cited by examiner

Primary Examiner—Steven J. Mottola
(74) Attorney, Agent, or Firm—Young & Thompson (57) ABSTRACT

This invention relates to an electronic circuit (predistortion type linearizer) for linearizing the nonlinear responses of amplifiers, to achieve low distortion, wide-dynamic range amplification particularly suitable for cellular handsets application.

10 Claims, 10 Drawing Sheets

PREDISTORTION TYPE LINEARIZER WITH A RESONANT CIRCUIT AND COMMON GATE FET

BACKGROUND OF THE INVENTION

1. Field of the Invention

This invention relates to an electronic circuit (predistortion type linearizer) for linearizing the nonlinear responses of amplifiers, achieving low distortion, wide-dynamic range amplification particularly suitable for cellular handsets application.

2. Description of the Related Art

Recent advances in digital cellular systems such as IS-95 or wide-band CDMA (W-CDMA) have demanded microwave amplifiers that can operate with low distortion and high efficiency over a wide output power range for cellular handsets application. To achieve low distortion amplification, transmitter amplifiers usually operate at power backoff, resulting in reduced efficiency of operation. One of the viable options to reduce distortion is to linearize the nonlinear responses of amplifiers using linearization scheme. Various types of amplifier linearization techniques, such as feedforward, predistortion and feedback, have been disclosed in "Feedforward linearization of 950 MHz amplifiers," by R. D. Stewart et al., IEE Proceedings-H, vol. 135, no. 5, pp. 347–350, October 1988; U.S. Pat. No. 5,850,162 by Danielsons; "An automatically controlled predistorter for multilevel quadrature amplitude modulation," by J. Namiki, IEEE Trans. Commun., vol. COM-31, no. 5, pp. 707–712, May 1983; U.S. Pat. No. 5,038,113 by Katz et al.; U.S. Pat. No. 4,465,980 by Huang et al.; U.S. Pat. No. 5,523,716 by Grebliunas et al.; "An MMAC C-Band FET feedback power amplifier," by A. K. Ezzeddine et al., IEEE Trans. Microwave Theory Tech., vol. MTT-38, no. 4, pp. 350–357, April 1990; "An MMIC linearized amplifier using active feedback," by J. C. Pedro et al., 1993 IEEE MTT-S Dig., pp. 95–98; U.S. Pat. No. 5,886,572 by Myers et al.; U.S. Pat. No. 5,821,814 by Katayama et al., but the requirement of small-sized handsets have restricted the number of linearization schemes that are applicable to handset amplifiers. Linearization schemes such as feedback and predistortion satisfy such requirement. However, feedback technique is not commonly used due to the possibility of endangering the stability of the amplifier to be linearized, and most applications are therefore based on the predistortion technique.

Figure 1:
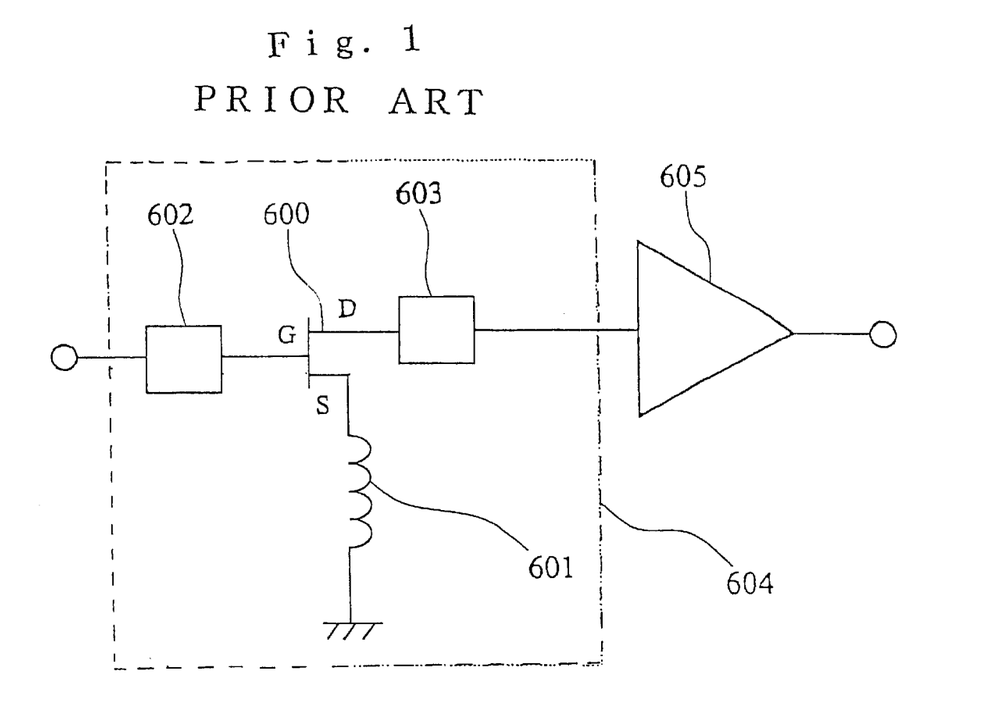
FIG. 1 illustrates the prior art, showing the schematic of a linearizer 604 using the common-source FET 600 with the source inductor 601 cascaded to the nonlinear amplifier 605.
Figure 2:
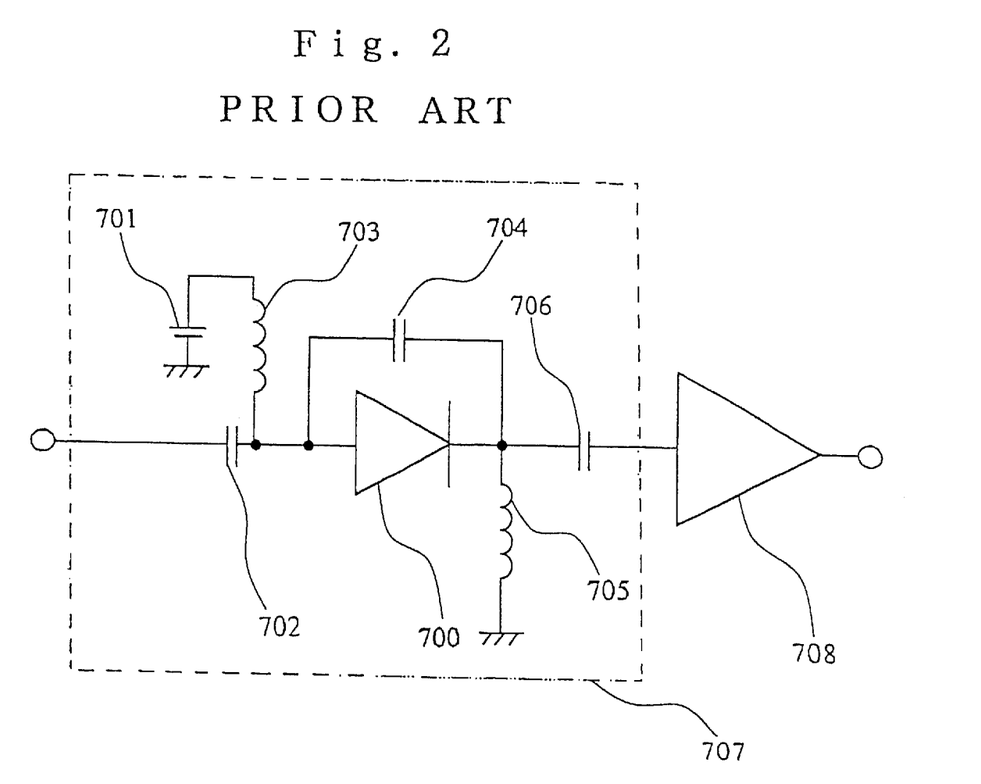
FIG. 2 illustrates the prior art, showing the schematic of the series diode linearizer 707 cascaded to the nonlinear amplifier 708.
Figure 3:
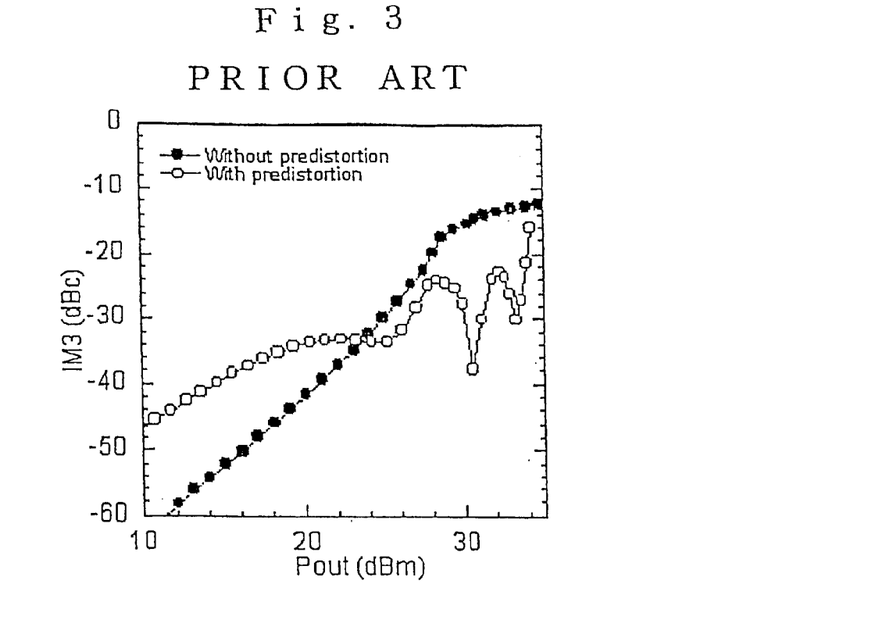
FIG. 3 illustrates the prior art, showing the IM3 response of an amplifier with and without predistortion linearization.

In the art of predistorter design applicable to handset amplifier linearization, a technique referred as common-source FET linearizer with source inductor was reported by M. Nakayama et al. in 1995 IEEE MTT-S digest, pp. 1451–1454. The schematic of this technique is shown in FIG. 1. The predistorter 604 consists of a common-source configured FET 600 with a source inductor 601. An input matching network 602 is connected to the gate (G) of the FET 600 and an output matching network 603 is connected to the drain (D) of the FET 600. The characteristics of gain and phase are function of the source inductor 601 with respect to input power. The predistorter 604 is cascaded to the input of the amplifier 605 to linearize its nonlinear effect. Another alternative form of predistorter was reported by K. Yamauchi et al. in 1996 MTT-S digest, pp. 831–834. This technique will be referred to as series diode linearizer. The schematic of this technique is shown in FIG. 2. The predistorter 707 employs a series diode 700 which is biased by a DC voltage source 701 via an inductor choke 703. Inductor 705 provides grounding for the DC voltage source 701. Capacitor 702 and capacitor 706 are used as input and output DC block respectively. Capacitor 704 is added to ensure a negative phase deviation of the diode linearizer with the increase in input power. The amplitude and phase characteristics of the diode linearizer 707 can be changed by adjusting the biasing voltage 701. The nonlinear effect of the amplifier 708 is linearized by the predistorter 707. A typical third-order intermodulation (IM3) response of such a linearized amplifier is shown in FIG. 3. The IM3 distortion level is improved over a limited range usually at higher output power region. At low output power, the IM3 level of the linearized amplifier is worsen compared to the case without the predistorter.

Figure 4:
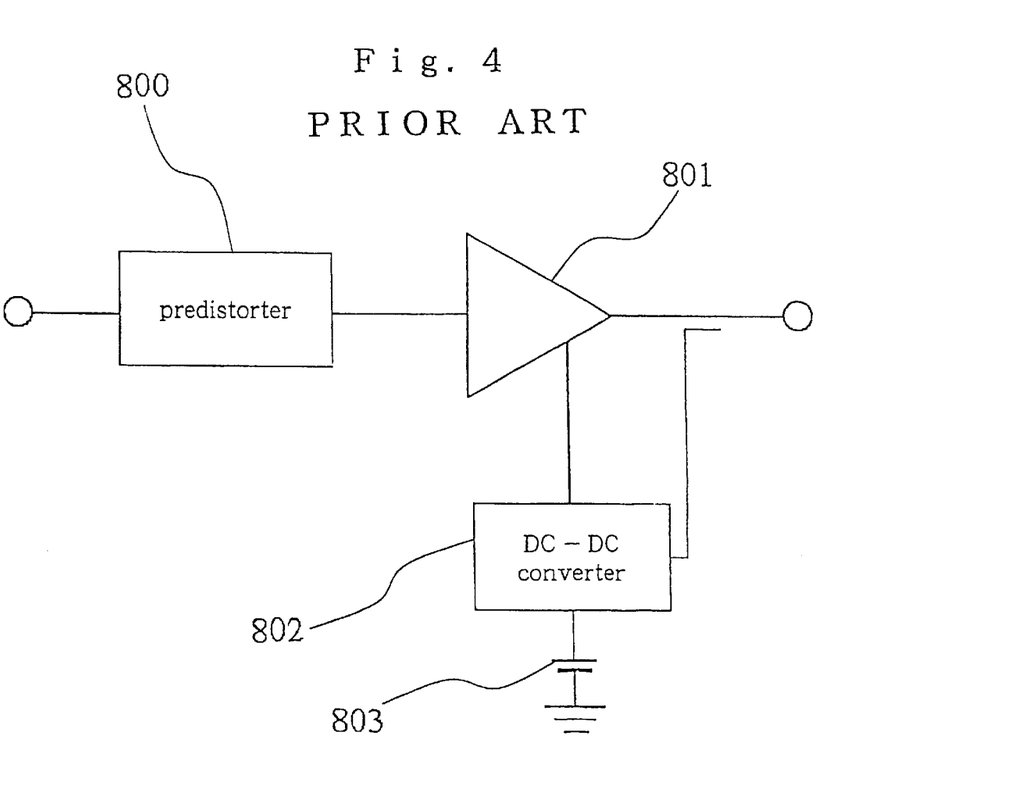
FIG. 4 illustrates the prior art, showing the schematic of the amplifier 801, implementing bias control using the DC-DC converter 802, with the predistortion type linearizer 800 connected to the input of the amplifier 801.

To achieve high efficiency operation over a wide output power range, amplifiers are commonly subjected to bias control. This technique can be combined with a predistorter to improve the efficiency of an amplifier as well as distortion level. FIG. 4 shows the schematic of such amplifier. The predistorter 800, having the form of 606 or 707 shown in FIG. 1 or 2, is connected in cascade to the amplifier 801. The bias of the amplifier 801 is controlled by the DC-DC converter 802 which has a DC voltage source 803. The DC-DC converter 802 changes the bias level of the amplifier 801 according to the output power level, enabling efficiency improvement. The incorporation of the predistorter 800 compensates the nonlinear effect of the amplifier 801 to reduce distortion at the output under high output power region.

While prior art method employing common-source FET 600 with source inductor 601 as a predistortion type linearizer 604, the large size of the source inductor 601 could prevent the realization of a miniaturized linearizer. The diode type linearizer 707 has the advantage of smaller size, but, similar to the common source FET linearizer 604, the amplitude and phase responses are dependent parameters on each other. Therefore it is difficult to tune the amplitude and phase responses of the linearizer independently to match that of a nonlinear amplifier.

In addition, the distortion improvement by incorporating a predistortion type linearizer to a nonlinear amplifier is usually restricted to a limited output power region. Outside that region, the distortion level is usually degraded compared to the case before linearization due to difficulty to match the gain and phase characteristics between the predistorter and amplifier over a wide power range. This could limit the dynamic range of an amplifier for application in systems such as IS-95 or W-CDMA. Furthermore, due to the use of a fix control voltage on a predistortion type linearizer, the response of such linearizer cannot dynamically track and match that of an amplifier implementing dynamic bias control for wide dynamic range, high efficiency operation, and thus degrades the overall distortion improvement.

The objective of this invention is to achieve an independent control on the phase and amplitude characteristics of a predistortion type linearizer. Such linearizer should have positive gain deviation and negative phase deviation with an increase in input power for compensating the gain compression and positive phase deviation characteristics of solid state, such as FET or HBT-based, amplifiers. The linearizer should also attain low loss and small size, which may be applied to linearize nonlinear amplifiers used in cellular handsets. Another objective of this invention is to develop control schemes such that amplifiers, incorporating the predistortion type linearizer, can achieve low distortion, high efficiency over a wide dynamic range of output power.

SUMMARY OF THE INVENTION

In claim 1, a predistortion type linearizer is invented to linearize the nonlinear responses of amplifiers. The linearizer has a small size suitable for MMIC (Microwave Monolithic IC) implementation. The linearizer is based on a common gate FET configuration, with a resonant circuit connected between drain and source terminals which minimizes the effect of the intrinsic capacitance of the FET on phase characteristic, and also reduces loss of the linearizer. The degree of negative phase deviation of the predistorter is determined by the gate inductor. Gate control voltage is utilized to adjust the amplitude characteristic of the predistorter. Inductors are connected between drain terminal of FET and ground, and between source terminal of FET and ground in order to achieve a negative phase deviation with an increase in input power. The capacitors connected between input and drain terminal of FET, and between output and source terminal of FET are for DC blocking purpose.

In claim 2, a predistortion type linearizer is invented to linearize the nonlinear responses of amplifiers. The linearizer has a small size suitable for MMIC implementation. The linearizer is based on a common gate FET configuration, with a resonant circuit connected between drain and source terminals which minimizes the effect of the intrinsic capacitance of the FET on phase characteristic, and also reduces loss of the linearizer. The degree of negative phase deviation of the predistorter is determined by the gate inductor. Both drain and gate control voltages are employed for tuning the amplitude and phase characteristics of the predistorter. Inductors are connected between drain terminal of FET and ground (via a RF bypass capacitor), and between source terminal of FET and ground in order to achieve a negative phase deviation with an increase in input power. The capacitors connected between input and drain terminal of FET, and between output and source terminal of FET are for DC blocking purpose.

In claim 3, a resonant circuit is invented for the predistorter of claim 1. The resonant circuit consists of an inductor and a capacitor connected in series. The inductor resonates with the intrinsic capacitance of the FET to minimize its effect on phase characteristic, and also reduces loss of the linearizer. The capacitor is used for DC blocking.

In claim 4, a resonant circuit is invented for the predistorter of claim 2. The resonant circuit consists of an inductor and a capacitor connected in series. The inductor resonates with the intrinsic capacitance of the FET to minimize its effect on phase characteristic, and also reduces loss of the linearizer. The capacitor is used for DC blocking.

In claim 5, a linearized amplifier is invented to improve the distortion level of a nonlinear amplifier over a wide dynamic range. The linearizer of claim 1 is connected in cascade to a nonlinear amplifier, linearizing the amplifier's nonlinear effect. A switch is applied to the gate control voltage of the linearizer which turns on or off the linearizer according the input power level, achieving low distortion over a wider range of output power than using a fixed gate control voltage. This invention also reduces the loss of the linearizer at low input power range.

In claim 6, a linearized amplifier is invented to improve the distortion level of a nonlinear amplifier over a wide dynamic range. The linearizer of claim 2 is connected in cascade to a nonlinear amplifier, linearizing the amplifier's nonlinear effect. A switch is applied to the gate control voltage of the linearizer which turns on or off the linearizer according the input power level, achieving low distortion over a wider range of output power than using a fixed gate control voltage. This invention also reduces the loss of the linearizer at low input power range.

In claim 7, a linearized amplifier is invented to improve the distortion level and efficiency of a nonlinear amplifier over a wide dynamic range. The linearizer of claim 1 is connected in cascade to a nonlinear amplifier. To linearize the nonlinear amplifier over a wide output power range, a control scheme is employed to the gate control voltage of the linearizer such that the characteristics of the linearizer change accordingly with the output power level of the nonlinear amplifier.

In claim 8, a linearized amplifier is invented to improve the distortion level and efficiency of a nonlinear amplifier over a wide dynamic range. The linearizer of claim 2 is connected in cascade to a nonlinear amplifier. To linearize the nonlinear amplifier over a wide output power range, a control scheme is employed to the gate control voltage of the linearizer such that the characteristics of the linearizer change accordingly with the output power level of the nonlinear amplifier.

In claim 9, a linearized amplifier is invented to improve the distortion level and efficiency of a nonlinear amplifier over a wide output power range. The linearizer of claim 1 is connected in cascade to a nonlinear amplifier, linearizing the amplifier's nonlinear effect. A control scheme for the linearized amplifier is developed which dynamically changes the drain and gate voltages of the nonlinear amplifier and the gate control voltage of the linearizer with the output power level. Therefore the linearizer's responses change dynamically to that of the nonlinear amplifier, achieving improvement on distortion level as well as efficiency over a wider output power range.

In claim 10, a linearized amplifier is invented to improve the distortion level and efficiency of a nonlinear amplifier over a wide output power range. The linearizer of claim 2 is connected in cascade to a nonlinear amplifier, linearizing the amplifier's nonlinear effect. A control scheme for the linearized amplifier is developed which dynamically changes the drain and gate voltages of the nonlinear amplifier and the gate control voltage of the linearizer with the output power level. Therefore the linearizer's responses change dynamically to that of the nonlinear amplifier, achieving improvement on distortion level as well as efficiency over a wider output power range.

The above and other objects, features and advantages of the present invention will become apparent from the following description with reference to the accompanying drawings which illustrate examples of the present invention.

DETAILED DESCRIPTION OF THE PREFERRED EMBODIMENTS

Preferred embodiment no. 1 is related to claim 1, 3, 5, 7 and 9. Preferred embodiment no. 2 is related to claim 2, 4, 6, 8, 10. Preferred embodiment no. 3 is related to claim 5, 6. Preferred embodiment no. 4 is related to claim 7, 8. Preferred embodiment no. 5 is related to claim 9, 10.

1st Embodiment

Figure 5:
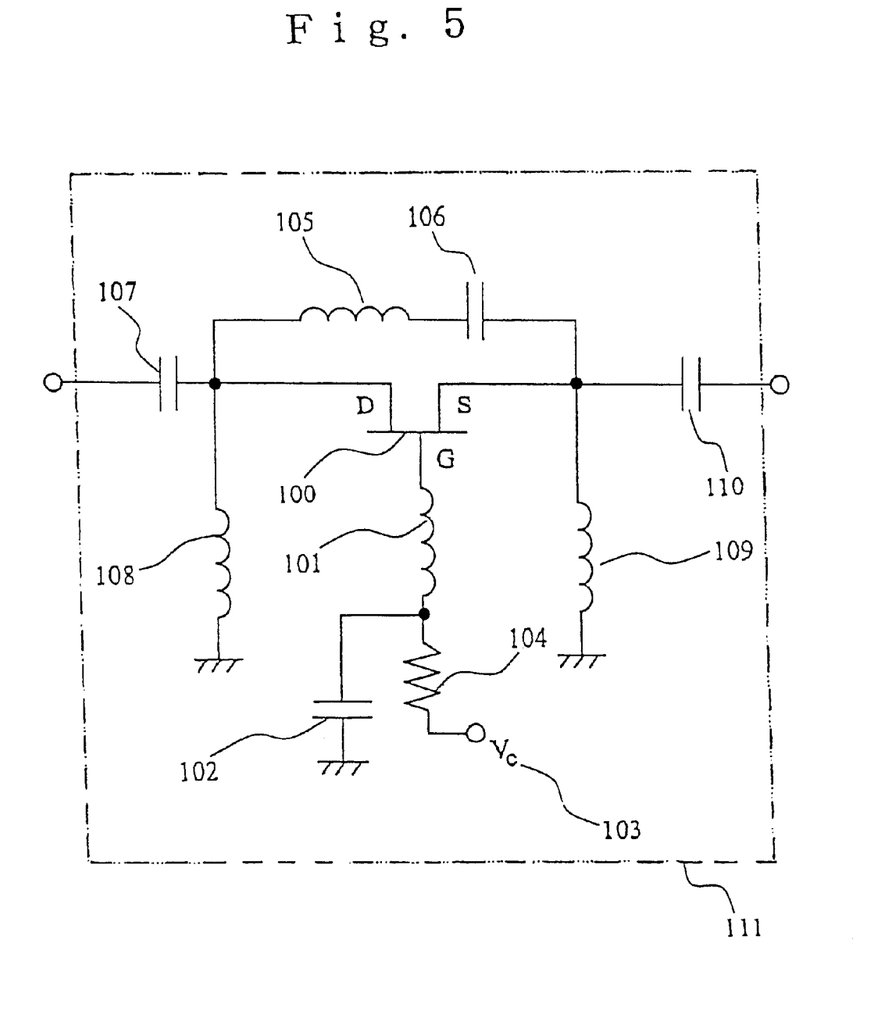
FIG. 5 illustrates the first preferred embodiment, showing the schematic of the proposed predistortion type linearizer 111 employing a common gate FET 100 with gate control voltage Vc 103, according to the present invention.

The first preferred embodiment of the present invention will be explained with reference to FIG. 5. FIG. 5 is a schematic of a proposed predistortion type linearizer 111. It consists of an inductor 101 connected to the gate (G) of a common gate FET 100 which follows by a capacitor 102. The value of inductor 101 determines the degree of negative phase deviation of the linearizer 111. The amplitude characteristic of the linearizer 111 can be controlled by the gate control voltage 103, Vc, which is applied to the FET 100 via bias feed resistor 104. A resonant network is connected between the drain (D) and source (S) of the FET 100. The purpose of the capacitor 106 is for DC blocking whereas the inductor 105 is to resonate with the intrinsic drain-to-source capacitance of the FET 100. At the operating (resonant) frequency, the resonant network resonates with the intrinsic capacitance of the FET 100, canceling its effect on phase characteristic, and also reducing loss of the linearizer 111. The intrinsic nonlinear conductance of the FET 100 determines the amplitude characteristic of the linearizer 100.

Inductors 108 and 109 are connected between drain terminal of FET 100 and ground, and between source terminal of FET 100 and ground, respectively, in order to achieve a negative phase deviation with an increase in input power on the predistortion type linearizer 111. Without these inductors, the predistortion type linearizer will only show a positive phase deviation which does not satisfy the purpose of this invention. The value of the inductors is in the range of 5 nH to 10 nH to guarantee the negative phase deviation. The series capacitors 107 and 110 serve as DC block for the input and output end of linearizer 111 respectively.

Figure 6A:
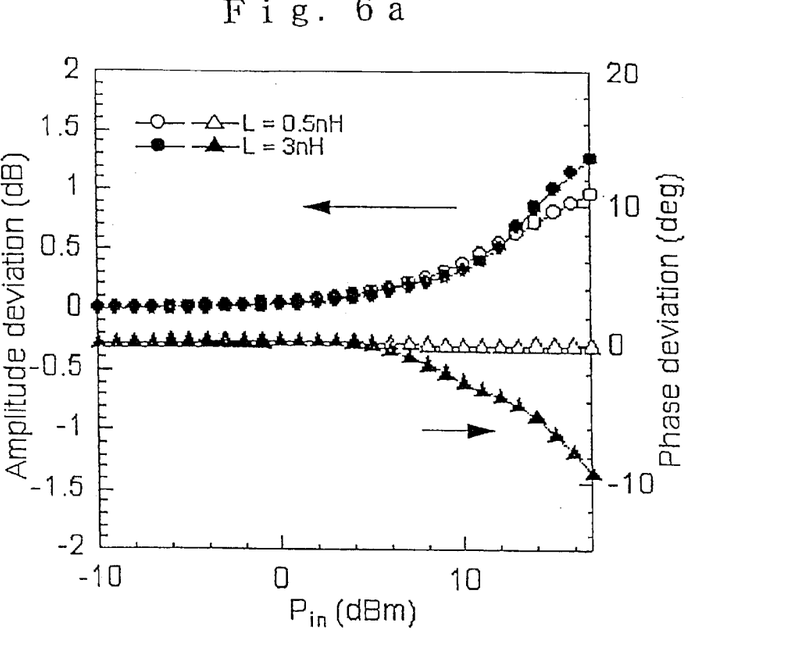
FIG. 6a shows the amplitude and phase deviations of the predistortion type linearizer 111 as a function of the gate inductance 101 (L)
Figure 6B:
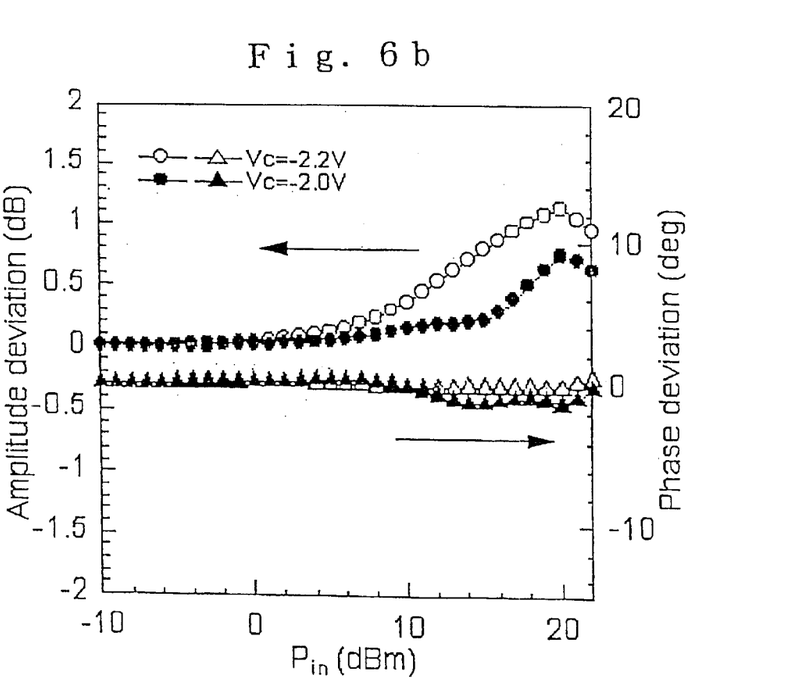
FIG. 6b shows the amplitude and phase deviations of the predistortion type linearizer 111 as a function of the gate control voltage Vc 103, according to the present invention.

The gain and phase deviation characteristics of the proposed linearizer 111 at 1.95 GHz are shown in FIG. 6a for two values of inductor 101. Similar gain expansions are achieved in the two cases for a wide range of input power whilst the degree of negative phase deviation depends on the value of inductor 101. FIG. 6b shows the gain and phase deviation responses of the linearizer 111 at 1.95 GHz for different values of gate control voltage 103 but with the same value of inductor 101. The gate control voltage 103 changes the gain expansion characteristic of the linearizer 111 but has negligible effect on the phase characteristic. Independent control on amplitude and phase characteristics of the linearizer 111 is therefore achieved. Note that FET 100 is biased near pinch-off such that the linearizer 111 experiences gain expansion and negative phase characteristics.

As shown by the above embodiment, the effect of this embodiment is to achieve positive gain and negative phase deviation with an increase in input power, and allow independent control on the amplitude and phase characteristics of a predistortion type linearizer 111. Therefore each response can be tailored to match that of a nonlinear amplifier. This embodiment is just an example of the principle of operation of the invention. The technique can be applied to FET devices such as MESFETs and HJFETs.

2nd Embodiment

Figure 7:
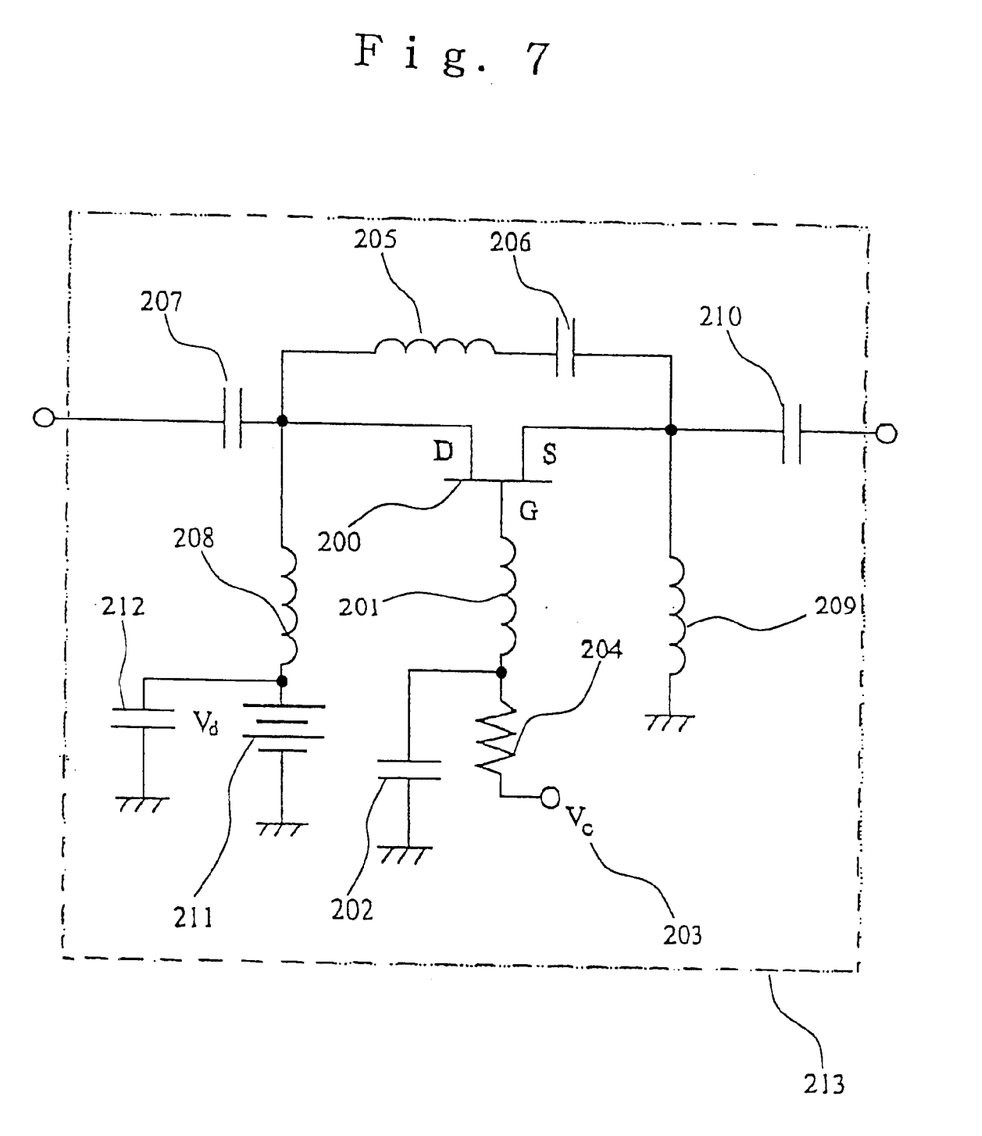
FIG. 7 illustrates the second preferred embodiment, showing the schematic of the proposed predistortion type linearizer 213 employing a common gate FET 200 with the drain control voltage Vd 211 and gate control voltage Vc 203, according to the present invention.

The second preferred embodiment of the present invention will be explained with reference to FIG. 7. FIG. 7 is a schematic of a proposed predistortion type linearizer 213. It consists of an inductor 201 connected to the gate (G) of a common gate FET 200 which follows by a capacitor 202. The value of inductor 201 determines the degree of negative phase deviation of the linearizer 213. A resonant network is connected between the drain (D) and source (S) of the FET 200. The purpose of the capacitor 206 is for DC blocking whereas the inductor 205 is to resonate with the intrinsic drain-to-source capacitance of the FET 200. At the operating (resonant) frequency, the resonant network resonates with the intrinsic capacitance of the FET 200, canceling its effect on phase characteristic, and also reducing loss of the linearizer 213.

Inductor 208 is connected between drain terminal of FET 200 to ground via an RF bypass capacitor 212. Inductor 209 is connected between source terminal of FET 200 and ground. The two inductors 208 and 209 are required in order to achieve a negative phase deviation with an increase in input power on the predistortion type linearizer 213. Without these inductors, the predistortion type linearizer will only show a positive phase deviation which does not satisfy the purpose of this invention. The value of the inductors is in the range of 5 nH to 10 nH to guarantee the negative phase deviation. The series capacitors 207 and 210 serve as DC block for the input and output end of linearizer 213 respectively.

The amplitude characteristic of the linearizer 200 can be controlled by the gate control voltage 204, Vc, which is applied to the gate (G) of the FET 200 via bias feed resistor 204. The drain bias control voltage 211, Vd, provides extra control on the amplitude and phase characteristics of the linearizer 213, and is fed to the drain (D) of FET 200 via the inductor 208. Capacitor 212 is a grounding capacitor to avoid RF signal reaching the DC voltage source 211.

Figure 8:
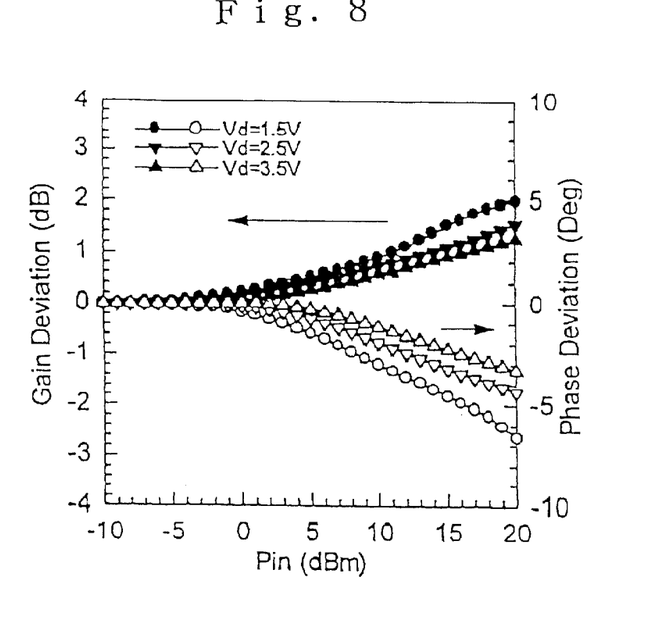
FIG. 8 illustrates the gain and phase deviations of the predistortion type linearizer 213 as a function of the drain control voltage Vd 211, according to the present invention.

The gain and phase deviation characteristics of the proposed linearizer 213 at 1.95 GHz are shown in FIG. 8 for two values of drain control voltage 211, Vd. FET 200 is biased near pinch-off by the gate control voltage 204, Vc, such that the linearizer 213 experiences gain expansion and negative phase deviation characteristics.

The effect of this embodiment is to provide an extra degree to control the responses of the linearizer 213 than that of the linearizer 111 discussed in the preferred embodiment no. 1. The extra control is achieved by employing an extra drain control voltage 211 such that the responses of the linearizer 213 can be easily tuned to match that of a nonlinear amplifier. This embodiment is just an example of the principle of operation of the invention. The technique can be applied to FET devices such as MESFETs and HJFETs.

3rd Embodiment

Figure 9:
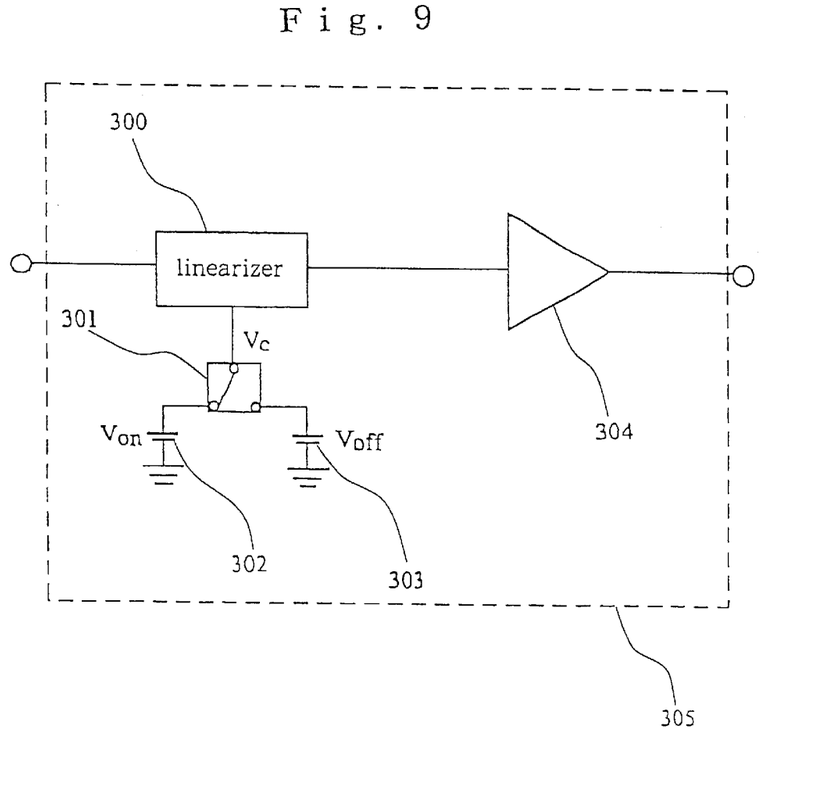
FIG. 9 illustrates the third preferred embodiment, showing the schematic of the linearized amplifier 305 with the switch 301 for changing the gate control voltage Vc of the linearizer 300 according to the present invention.

The third preferred embodiment of the present invention is a linearized amplifier which has low distortion over a wide range of output power employing the design of claim 1 or 2, and will be explained with reference to FIG. 9. FIG. 9 shows the invented design of a low distortion, wide dynamic range linearized amplifier 305. Linearized amplifier 305 consists of a linearizer 300 connected in cascade to a nonlinear amplifier 304. The linearizer 300 is in the form of the predistortion type linearizer 111 or 213 described in the preferred embodiment no. 1 and 2 respectively, and is designed to have opposite gain and phase responses, as a function of input power, to that of the nonlinear amplifier 304. The gate control voltage, Vc, of the predistortion type linearizer 300 is equal to either Von 302 or Voff 303 which is controlled by the switch 301.

Figure 10A:
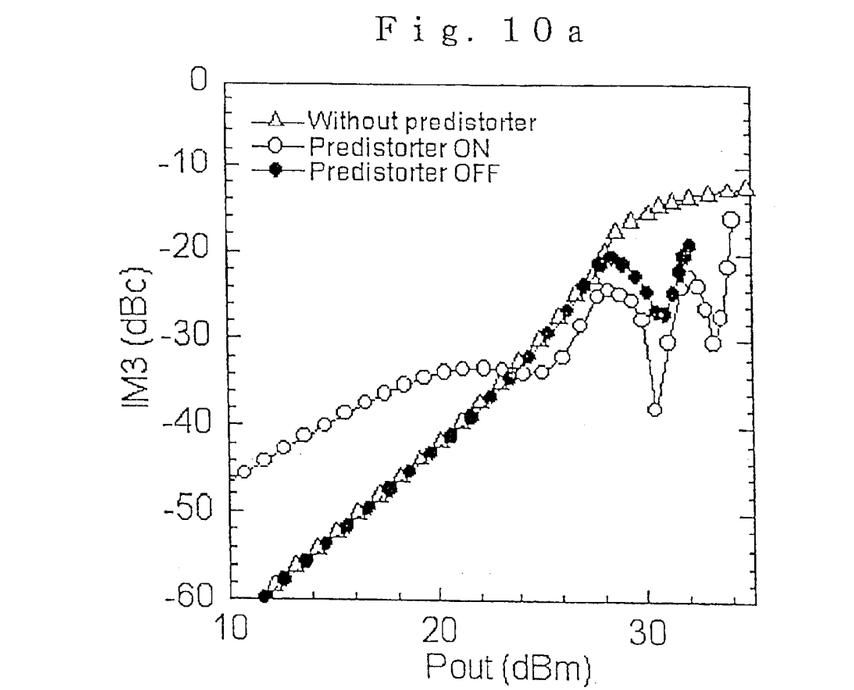
FIG. 10a shows the IM3 responses of the linearized amplifier 305 for two different states of the predistortion type linearizer 300.
Figure 10B:
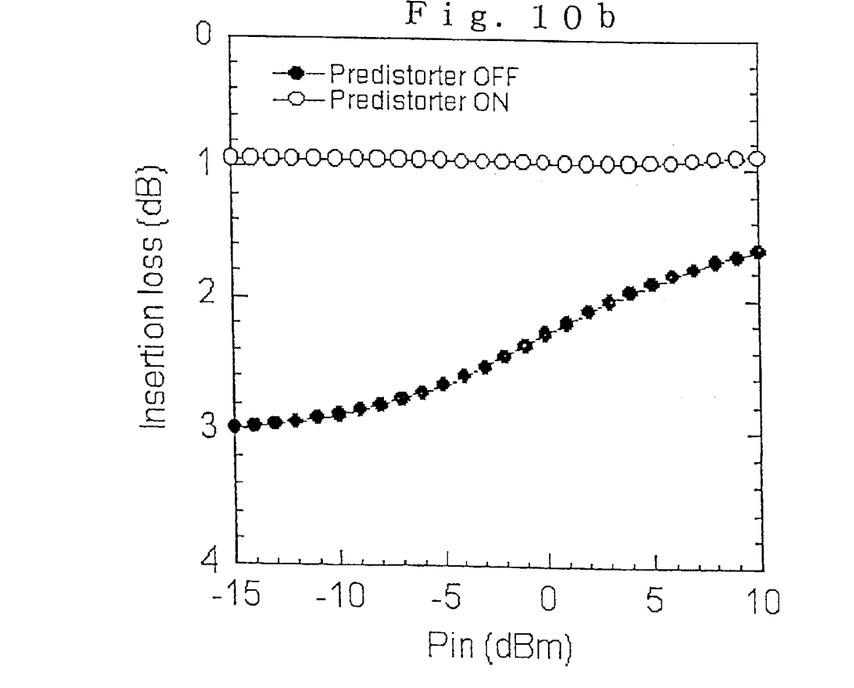
FIG. 10b shows the insertion loss of the linearizer 300 of the linearized amplifier 305 under two different gate control voltage Vc.

The third-order intermodulation (IM3) distortion of the proposed linearized amplifier 305 at 1.95 GHz is shown in FIG. 10a. When the gate control voltage Vc is equal to Von 302, the linearizer 300 is at its ON-state and is under normal operation, IM3 level is improved at high output power level compared to the case without linearization, but worsen at the low output power region. When Vc is switched to Voff 303, the linearizer is at its OFF-state, the IM3 level is improved at low output power region compared to the ON-state. The insertion loss characteristic of the predistortion type linearizer 300 under the two states of operation at 1.95 GHz is shown in FIG. 10b. The OFF-states operation of the linearizer 300 offers lower insertion loss than the ON-state operation.

As illustrated by the above embodiment, the effect of the invented method is to achieve low distortion at the output of the linearized amplifier 305 over a wide output power range. By appropriately switching the gate control voltage, Vc, of the linearizer 300, distortion improvement can be achieved at high output power level without degrading the distortion at low output power region, making the linearized amplifier 305 suitable for wide dynamic range operation. The switching of switch 301 can be controlled by power control scheme implemented in cellular systems such as IS-95 or W-CDMA, therefore eliminating the need of input/output power monitoring circuitry. An added advantage of this proposed configuration is that the loss of the predistortion type linearizer 300 can be reduced at OFF-state operation, minimizing the gain loss of the linearized amplifier 305 at low output power level. The amplifier 304 discussed in this embodiment can be a single or multi-stage design and implemented by different technology such as BJT or FET, having gain compression and positive phase deviation characteristics with an increase in input power. While the preferred embodiment has been described in connection with handset amplifier, the linearized amplifier will find application in various communication systems requiring linear amplification of signals employing various modulation formats.

4th Embodiment

Figure 11:
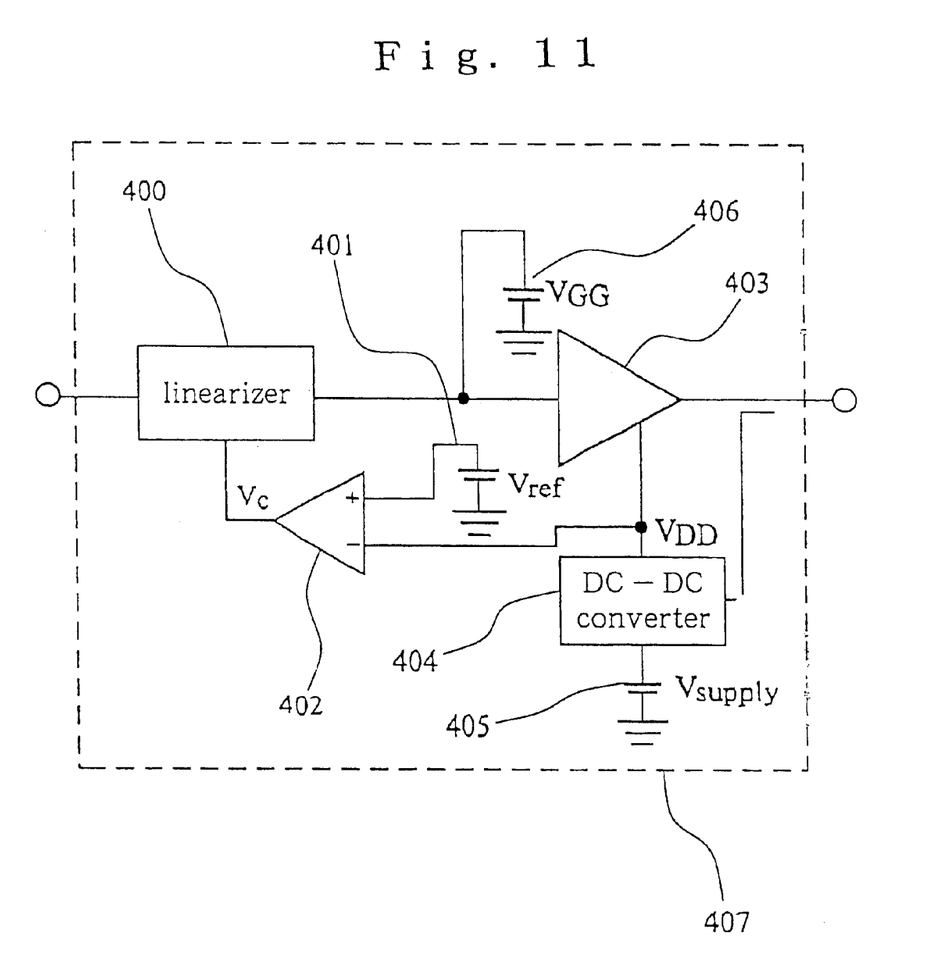
FIG. 11 illustrates the fourth preferred embodiment, showing the schematic of the linearized amplifier 407 using the DC-DC converter 404 for the drain bias control of the amplifier 403 and the dynamic controlled predistortion type linearizer 400 according to the present invention.

The fourth preferred embodiment of the present invention is a linearized amplifier which offers a dynamic control on the characteristic of a predistortion type linearizer, employing the design of claim 1 or 2, and will be explained with reference to FIG. 11. FIG. 11 shows the invented design of a dynamic control linearized amplifier 407. Dynamic control linearized amplifier 407 consists of a linearizer 400 connected in cascade to a nonlinear amplifier 403. Assuming the amplifier 403 is an FET type, its gate voltage is supplied by the DC voltage source VGG 406, and its drain voltage VDD is dynamically controlled by the DC-DC converter 404 as a function of the output power level. The output of the DC-DC converter 404 can be either determined by monitoring the output power level of the linearized amplifier 407 as shown in this embodiment, or simply controlled by power control scheme implemented in cellular systems such as IS-95 or W-CDMA which can eliminates the need of output power sampler shown in FIG. 11. Vsupply 405 is the power supply of the DC-DC converter 404. The linearizer 400 is in the form of the predistortion type linearizer 111 or 213 described in the preferred embodiment no. 1 and 2 respectively, and is designed to have opposite gain and phase responses to that of the nonlinear amplifier 403. The differential amplifier 402 amplifies the voltage difference between the reference voltage Vref 401 and the drain voltage VDD of the amplifier 403. The output of the differential amplifier 402 supplies the gate control voltage Vc to the predistortion type linearizer 400. The gate control voltage Vc therefore changes dynamically due to the continuous change of the drain control voltage VDD with the output power. Thus the response of predistortion type linearizer 400 is changed dynamically to match that of the amplifier 403.

As illustrated by the above embodiment, the effect of the invented method is to achieve distortion improvement on a dynamic bias-controlled amplifier. High efficiency operation is achieved by the linearized amplifier 407 due to the implementation of the dynamic drain bias control. With the implementation of the control scheme on the predistortion type linearizer 400 illustrated in this preferred embodiment, the change on the response on the amplifier 403 due to dynamic bias control is matched by that of the predistortion type linearizer 400, resulting in distortion improvement over a wide output power range. Although FET amplifier was chosen as an example in this embodiment, this technique can be equally applied to any amplifier implemented by different technology such as BJT or FET. While the preferred embodiment has been described in connection with handset amplifier, the linearized amplifier will find application in various communication systems requiring linear amplification of signals employing various modulation formats.

5th Embodiment

Figure 12:
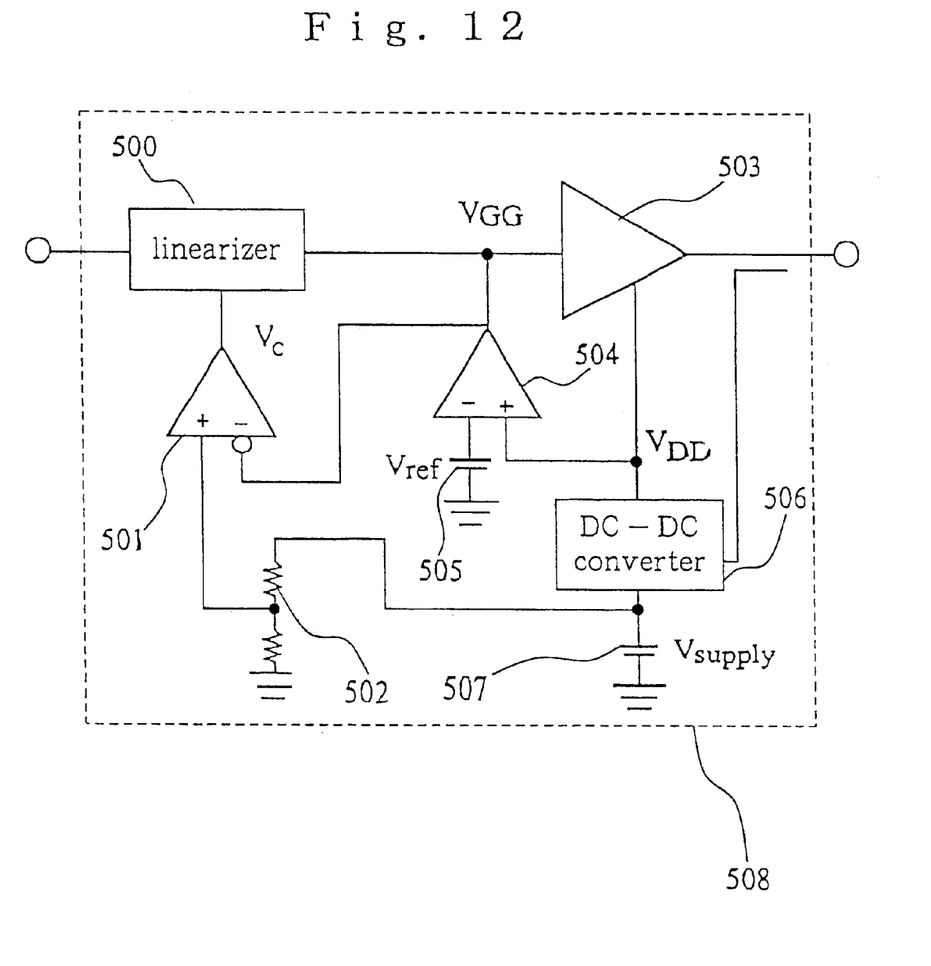
FIG. 12 illustrates the fifth preferred embodiment, showing the schematic of the linearized amplifier 508 using dynamic control on the drain and gate voltages of the amplifier 503, and the gate control voltage Vc of the predistortion type linearizer 500 according to the present invention.

The fifth preferred embodiment of the present invention is an embodiment to achieve dynamic control on the drain and gate voltages of an FET amplifier and the linearizer, employing the design of claim 1 or 2, of a linearized amplifier and will be explained with reference to FIG. 12. FIG. 12 shows the invented design of a dynamic control linearized amplifier 508. It consists of a linearizer 500 connected in cascade to a FET amplifier 503. The drain voltage VDD of the amplifier 503 is dynamically controlled by the DC-DC converter 506 as a function of output power level. The output of the DC-DC converter 506 can be either determined by monitoring the output power level of the linearized amplifier 508 as shown in this embodiment, or simply controlled by power control scheme implemented in cellular systems such as IS-95 or W-CDMA which can eliminates the need of output power sampler shown in FIG. 12. Vsupply 507 is the power supply of the DC-DC converter 506. The differential amplifier 504 amplifies the voltage difference between the reference DC voltage Vref 505 and the drain voltage VDD of the amplifier 503, and is used as the gate bias voltage VGG of the amplifier 503, achieving a dynamic control on the drain and gate bias of the amplifier 503. The linearizer 500 is in the form of the predistortion type linearizer 111 or 213 described in the preferred embodiment no. 1 and 2 respectively, and is designed to have opposite gain and phase responses to that of the amplifier 503. The differential amplifier 501 amplifies the voltage difference between the gate voltage VGG of the amplifier 503 and the voltage from the resistive voltage divider 502. The output of the differential amplifier 501 supplies the gate control voltage Vc to the predistortion type linearizer 500, realizing a dynamic control.

As illustrated by the above embodiment, the effect of the invented method is to achieve distortion improvement on a dynamic bias-controlled amplifier. High efficiency operation over a wide output power range is achieved by the linearized amplifier 508 due to the implementation of both dynamic drain and gate bias control. With the implementation of the control scheme on the predistortion type linearizer 500 illustrated in this preferred embodiment, the response of the predistortion type linearizer 500 changes dynamically to match that of the amplifier 503. Thus distortion improvement over wide output power range is achieved. Although FET amplifier was chosen as an example in this embodiment, this technique can be equally applied to any amplifier implemented by different technology such as BJT or FET. While the preferred embodiment has been described in connection with handset amplifier, the linearized amplifier will find application in various communication systems requiring linear amplification of signals employing various modulation formats.

While preferred embodiments of the present invention have been described using specific terms, such description is for illustrative purposes only, and it is to be understood that changes and variations may be made without departing from the spirit or scope of the following claims.

What is claimed is:

1. A predistortion type linearizer comprising:

an input and an output;

a ground node;

an FET having a drain node, a gate node and a source node;

a resonant circuit having an input node and an output node;

a first, second and third inductor each having an input node and an output node;

a first, second and third capacitor each having an input node and an output node;

a resistor having an input node and an output node;

said input node and said output node of said resonant circuit connected to said drain node and said source node of said FET respectively;

said input node of said first inductor connected to said gate node of said FET;

said input node of said first capacitor connected to said output node of said first inductor;

said output node of said first capacitor connected to said ground node;

a gate control voltage node connected to said input node of said resistor;

said output node of said resistor connected to said output node of said first inductor;

said input node and said output node of said second inductor connected to said drain node of said FET and said ground node respectively;

said input node and said output node of said third inductor connected to said source node of said FET and said ground node respectively;

said input node and said output node of said second capacitor connected to said input and said drain node of said FET respectively; and said input node and said output node of said third capacitor connected to said source node of said FET and said output respectively.

2. A predistortion type linearizer comprising:

an input and an output;

a ground node;

an FET having a drain node, a gate node and a source node;

a resonant circuit having an input node and an output node;

a first, second and third inductor each having an input node and an output node;

a first, second, third and fourth capacitor each having an input node and an output node;

a resistor having an input node and an output node;

said input node and said output node of said resonant circuit connected to said drain node and said source node of said FET respectively;

said input node of said first inductor connected to said gate node of said FET;

said input node of said first capacitor connected to said output node of said first inductor;

said output node of said first capacitor connected to said ground node;

a gate control voltage node connected to said input node of said resistor;

said output node of said resistor connected to said output node of said first inductor;

said input node and said output node of said second inductor connected to said drain node of said FET and said input node of said second capacitor respectively;

said output node of said second capacitor connected to said ground node;

a DC voltage source connected between said output node of said second inductor and said ground node;

said input node and said output node of said third inductor connected to said source node of said FET and said ground node respectively;

said input node and said output node of said third capacitor connected to said input and said drain node of said FET respectively; and said input node and said output node of said fourth capacitor connected to said source node of said FET and said output respectively.

3. The predistortion type linearizer of claim 1, wherein said resonant circuit comprises an inductor and a capacitor connected in series.

4. The predistortion type linearizer of claim 2, wherein said resonant circuit comprises an inductor and a capacitor connected in series.

5. A linearized amplifier comprising:

an input and an output;

an amplifier having an input node and an output node;

a switch having an output node, a first input node and a second input node;

said input of said predistortion type linearizer of claim 1 connected to said input;

said output of said predistortion type linearizer connected to said input node of said amplifier;

said output node of said amplifier connected to said output;

said output node of said switch connected to said gate control voltage node of said predistortion type linearizer;

first DC voltage source connected to said first input node of said switch; and second DC voltage source connected to said second input node of said switch.

6. A linearized amplifier comprising:

an input and an output;

an amplifier having an input node and an output node;

a switch having an output node, a first input node and a second input node;

said input of said predistortion type linearizer of claim 2 connected to said input;

said output of said predistortion type linearizer connected to said input node of said amplifier;

said output node of said amplifier connected to said output;

said output node of said switch connected to said gate control voltage node of said predistortion type linearizer;

first DC voltage source connected to said first input node of said switch; and second DC voltage source connected to said second input node of said switch.

7. A linearized amplifier comprising:

an input and an output;

an amplifier having an input node, an output node and a supply voltage node;

a differential amplifier having an output node, a positive input node and a negative input node;

a DC-DC converter having an output node, an input node, and a supply voltage node;

said input of said predistortion type linearizer of claim 1 connected to said input;

said output of said predistortion type linearizer connected to said input node of said amplifier;

said output node of said amplifier connected to said output;

said output node of said amplifier coupled to said input node of said DC-DC converter;

a first DC voltage source connected to said supply voltage node of said DC-DC converter;

said output node of said DC-DC converter connected to said supply voltage node of said amplifier;

a second DC voltage source connected to said input node of said amplifier;

said output node of said DC-DC converter connected to said negative input node of said differential amplifier;

a third DC voltage source connected to said positive input node of said differential amplifier; and said output node of said differential amplifier connected to said gate control voltage node of said predistortion type linearizer.

8. A linearized amplifier comprising:

an input and an output;

an amplifier having an input node, an output node and a supply voltage node;

a differential amplifier having an output node, a positive input node and a negative input node;

a DC-DC converter having an output node, an input node, and a supply voltage node;

said input of said predistortion type linearizer of claim 2 connected to said input;

said output of said predistortion type linearizer connected to said input node of said amplifier;

said output node of said amplifier connected to said output;

said output node of said amplifier coupled to said input node of said DC-DC converter;

a first DC voltage source connected to said supply voltage node of said DC-DC converter;

said output node of said DC-DC converter connected to said supply voltage node of said amplifier;

a second DC voltage source connected to said input node of said amplifier;

said output node of said DC-DC converter connected to said negative input node of said differential amplifier;

a third DC voltage source connected to said positive input node of said differential amplifier; and said output node of said differential amplifier connected to said gate control voltage node of said predistortion type linearizer.

9. A linearized amplifier comprising:

an input and an output;

a ground node;

an amplifier having an input node, an output node and a supply voltage node;

a first differential amplifier having an output node, a positive input node and a negative input node;

a second differential amplifier having an output node, a positive input node and an inverted negative input node;

a DC-DC converter having an output node, an input node, and a supply voltage node;

a first and second resistor each having an input node and an output node;

said input of said predistortion type linearizer of claim 1 connected to said input;

said output of said predistortion type linearizer connected to said input node of said amplifier;

said output node of said amplifier connected to said output;

said output node of said amplifier coupled to said input node of said DC-DC converter;

a first DC voltage source connected to said supply voltage node of said DC-DC converter;

said output node of said DC-DC converter connected to said supply voltage node of said amplifier;

said output node of said DC-DC converter connected to said positive input node of said first differential amplifier;

a second DC voltage source connected to said negative input node of said first differential amplifier;

said output node of said first differential amplifier connected to said input node of said amplifier;

said supply voltage node of said DC-DC converter connected to said input node of said first resistor;

said output node of said first resistor connected to said input node of said second resistor;

said output node of said second resistor connected to said ground node;

said output node of said first resistor connected to said positive input node of said second differential amplifier;

said output node of said first differential amplifier connected to said inverted negative voltage node of said second differential amplifier; and said output node of said second differential amplifier connected to said gate control voltage node of said predistortion type linearizer.

10. A linearized amplifier comprising:

an input and an output;

a ground node;

an amplifier having an input node, an output node and a supply voltage node;

a first differential amplifier having an output node, a positive input node and a negative input node;

a second differential amplifier having an output node, a positive input node and an inverted negative input node;

a DC-DC converter having an output node, an input node, and a supply voltage node;

a first and second resistor each having an input node and an output node;

said input of said predistortion type linearizer of claim 2 connected to said input;

said output of said predistortion type linearizer connected to said input node of said amplifier;

said output node of said amplifier connected to said output;

said output node of said amplifier coupled to said input node of said DC-DC converter;

a first DC voltage source connected to said supply voltage node of said DC-DC converter;

said output node of said DC-DC converter connected to said supply voltage node of said amplifier;

said output node of said DC-DC converter connected to said positive input node of said first differential amplifier;

a second DC voltage source connected to said negative input node of said first differential amplifier;

said output node of said first differential amplifier connected to said input node of said amplifier;

said supply voltage node of said DC-DC converter connected to said input node of said first resistor;

said output node of said first resistor connected to said input node of said second resistor;

said output node of said second resistor connected to said ground node;

said output node of said first resistor connected to said positive input node of said second differential amplifier;

said output node of said first differential amplifier connected to said inverted negative voltage node of said second differential amplifier; and said output node of said second differential amplifier connected to said gate control voltage node of said predistortion type linearizer.

* * * * *